US006673889B1

(12) United States Patent
Weinert et al.

(10) Patent No.: US 6,673,889 B1
(45) Date of Patent: *Jan. 6, 2004

(54) RADIATION CURABLE COATING CONTAINING POLYFUOROOXETANE

(75) Inventors: Raymond J. Weinert, Macedonia, OH (US); Guillermina C. Garcia, Akron, OH (US); James E. Robbins, Twinsburg, OH (US); Aslam Malik, Cameron Park, CA (US)

(73) Assignee: Omnova Solutions Inc., Fairlawn, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/397,715

(22) Filed: Sep. 16, 1999

Related U.S. Application Data

(60) Provisional application No. 60/141,532, filed on Jun. 28, 1999.

(51) Int. Cl.$^7$ .......................... C08G 18/50; C08G 18/67; C08L 75/08; C08L 75/16; C07C 271/08
(52) U.S. Cl. .......................... 528/70; 528/75; 528/76; 560/26; 560/33; 560/115; 560/158; 560/166; 560/167; 525/455; 525/460; 525/123; 525/127; 525/129; 526/292.9; 526/294; 526/295; 526/296; 526/301
(58) Field of Search .............................. 528/70, 75, 76; 560/26, 33, 115, 158, 166, 167; 525/455, 460, 123, 127, 129; 526/292.9, 294, 295, 296, 301

(56) References Cited

U.S. PATENT DOCUMENTS

| | | | |
|---|---|---|---|
| 2,995,571 A | 8/1961 | Harris, Jr. .................. 549/511 |
| 3,096,344 A | 7/1963 | Case ......................... 549/511 |
| 3,100,722 A | 8/1963 | Hermann et al. ........... 428/325 |
| 3,164,610 A | 1/1965 | Davis ......................... 549/511 |
| 3,210,298 A | 10/1965 | Weissermel et al. ........ 528/402 |
| 3,457,193 A | 7/1969 | Tinsley et al. ................ 528/73 |
| 3,547,894 A | 12/1970 | Smeltz et al. ................ 528/70 |
| 3,576,802 A | 4/1971 | Liiders et al. .............. 549/435 |
| 3,609,156 A | 9/1971 | Munakata et al. .......... 546/240 |
| 3,834,823 A | 9/1974 | Sergely et al. ............. 401/198 |
| 3,922,457 A | 11/1975 | Barnwell et al. ........... 428/207 |
| 3,949,132 A | 4/1976 | Seregely et al. ........... 428/207 |
| 4,051,195 A | 9/1977 | McWhorter .................. 528/106 |
| 4,118,541 A | 10/1978 | Power et al. ............... 428/452 |
| 4,166,881 A | 9/1979 | Congdon et al. ........... 428/463 |
| 4,603,074 A | 7/1986 | Pate et al. .................. 428/172 |
| 4,686,275 A | 8/1987 | Bryant et al. ............. 528/295.5 |
| 4,709,060 A | 11/1987 | Ohsaka et al. .............. 549/511 |
| 4,746,576 A | 5/1988 | Ozu et al. ................... 428/421 |
| 4,804,572 A | 2/1989 | Bodrogi ...................... 428/195 |
| 4,830,884 A | 5/1989 | Krug et al. ................. 427/244 |
| 4,857,396 A | 8/1989 | Otonari et al. ............ 428/315.5 |
| 4,898,981 A | 2/1990 | Falk et al. .................... 568/28 |
| 4,946,992 A | 8/1990 | Falk et al. .................. 560/227 |
| 4,988,123 A | 1/1991 | Lin et al. ................... 281/15.1 |
| 4,988,797 A | 1/1991 | Wardle et al. .............. 528/408 |
| 5,025,052 A | 6/1991 | Crater et al. ................ 524/104 |
| 5,043,221 A | 8/1991 | Koleske ...................... 428/413 |
| 5,045,624 A | 9/1991 | Falk et al. .................... 528/70 |
| 5,097,048 A | 3/1992 | Falk et al. .................... 549/511 |
| 5,099,026 A | 3/1992 | Crater et al. ................ 548/229 |
| 5,099,074 A | 3/1992 | Mueller et al. ............. 568/617 |
| 5,189,135 A | 2/1993 | Cozzi et al. .................. 528/70 |
| 5,210,179 A | 5/1993 | Stewart ...................... 528/408 |
| 5,214,121 A | 5/1993 | Mosch et al. ................ 528/49 |
| 5,230,954 A | 7/1993 | Sakamoto et al. .......... 428/332 |
| 5,322,861 A | 6/1994 | Tsuge et al. .................. 522/90 |
| 5,324,764 A | 6/1994 | Fujita et al. ................. 524/377 |
| 5,346,755 A | 9/1994 | Morse ........................ 428/286 |
| 5,361,164 A | 11/1994 | Steliga ........................ 359/455 |
| 5,414,143 A | 5/1995 | Weyer et al. ................ 568/617 |
| 5,468,841 A | 11/1995 | Malik et al. ................. 528/408 |
| 5,476,721 A | 12/1995 | Simeone et al. ............ 428/482 |
| 5,519,151 A | 5/1996 | Petrov et al. ............... 549/510 |
| 5,543,200 A | 8/1996 | Hargis et al. ............... 428/122 |
| 5,576,095 A | 11/1996 | Ueda et al. .................. 428/224 |
| 5,605,956 A | 2/1997 | Anton et al. ................. 524/590 |
| 5,627,238 A | 5/1997 | Anton et al. .............. 525/330.3 |
| 5,631,340 A | 5/1997 | Olstein ........................ 528/59 |
| 5,632,958 A | 5/1997 | Kane et al. ............... 422/82.07 |
| 5,637,657 A | 6/1997 | Anton ......................... 525/445 |
| 5,637,772 A | 6/1997 | Malik et al. ................. 564/505 |

(List continued on next page.)

FOREIGN PATENT DOCUMENTS

| | | |
|---|---|---|
| BE | 881228 | 5/1980 |
| BE | 1003706 | 5/1992 |
| DE | 1629566 | 1/1971 |
| DE | 2834849 | 2/1980 |
| DE | 3112704 | 10/1982 |
| DE | 3636264 | 5/1988 |
| DE | 293600 | 9/1991 |
| DE | 19535729 | 3/1997 |
| EP | 0 348 350 | 12/1989 |
| EP | 467570 | 1/1992 |
| EP | 491357 | 6/1992 |
| EP | 554798 | 8/1993 |
| EP | 569640 | 11/1993 |

(List continued on next page.)

*Primary Examiner*—Rabon Sergent
(74) *Attorney, Agent, or Firm*—Daniel J. Hudak; David G. Burleson

(57) ABSTRACT

Acrylate, or methacrylate, or allylic, functionalized polyfluorooxetanes are disclosed for use in radiation curable coating compositions. These acrylate, or methacrylate, or allylic, functionalized polymers provide improvements in wetting and surface properties that have previously been provided by migratory chemicals such as waxes and oils. The partially or fully fluorinated side groups of the fluorooxetanes are believed to be disproportionately present at the interfaces between the coating and the substrate and between the coating and the atmosphere.

17 Claims, No Drawings

U.S. PATENT DOCUMENTS

| | | | |
|---|---|---|---|
| 5,641,853 A | 6/1997 | Drysdale | 528/233 |
| 5,649,828 A | 7/1997 | Kawashima | 434/411 |
| 5,650,483 A | 7/1997 | Malik et al. | 528/402 |
| 5,654,450 A | 8/1997 | Malik et al. | 549/511 |
| 5,663,289 A | 9/1997 | Archibald et al. | 528/414 |
| 5,668,250 A | 9/1997 | Malik | 528/402 |
| 5,668,251 A | 9/1997 | Malik et al. | 528/402 |
| 5,672,651 A | 9/1997 | Smith | 524/590 |
| 5,674,951 A | 10/1997 | Hargis et al. | 525/410 |
| 5,681,890 A | 10/1997 | Tanaka et al. | 524/539 |
| 5,703,194 A | 12/1997 | Malik et al. | 528/70 |
| 5,747,552 A | 5/1998 | Smith | 522/96 |
| 5,798,402 A | 8/1998 | Fitzgerald et al. | 524/167 |
| 5,807,977 A | 9/1998 | Malik et al. | 528/402 |
| 5,849,944 A | 12/1998 | Allen et al. | 560/26 |
| 5,898,046 A | 4/1999 | Raiford et al. | 524/316 |
| 5,952,422 A | 9/1999 | Chang et al. | 524/590 |
| 5,990,190 A | 11/1999 | Nakamura et al. | 522/81 |
| 6,015,914 A | 1/2000 | Sasaki et al. | 549/510 |
| 6,037,483 A | 3/2000 | Malik et al. | 549/511 |
| 6,040,419 A | 3/2000 | Drysdale et al. | 528/408 |
| 6,080,830 A | 6/2000 | Dirschl et al. | 528/45 |
| 6,168,866 B1 | 1/2001 | Clark | 428/421 |
| 6,200,732 B1 | 3/2001 | Tamura et al. | 430/284.1 |
| 6,313,335 B1 | 11/2001 | Roberts et al. | 556/419 |
| 6,380,351 B1 | 4/2002 | Malik et al. | 528/402 |
| 6,391,459 B1 | 5/2002 | Szum et al. | 428/421 |
| 6,448,368 B1 | 9/2002 | Malik et al. | 528/402 |

FOREIGN PATENT DOCUMENTS

| | | | |
|---|---|---|---|
| JP | 55160063 | | 12/1980 |
| JP | 56159260 | | 12/1981 |
| JP | 57080432 | | 5/1982 |
| JP | 57167251 | | 10/1982 |
| JP | 57172915 | | 10/1982 |
| JP | 58008650 | | 1/1983 |
| JP | 58057954 | | 4/1983 |
| JP | 58096659 | | 6/1983 |
| JP | 58145767 | | 8/1983 |
| JP | 58158248 | | 9/1983 |
| JP | 60094468 | | 5/1985 |
| JP | 60125637 | | 7/1985 |
| JP | 60245552 | | 12/1985 |
| JP | 62129320 | | 6/1987 |
| JP | 62149764 | | 7/1987 |
| JP | 62-169641 | * | 7/1987 |
| JP | 62249740 | | 10/1987 |
| JP | 62275136 | | 11/1987 |
| JP | 63017940 | | 1/1988 |
| JP | 63-248827 | * | 10/1988 |
| JP | 63254139 | | 10/1988 |
| JP | 2006878 | | 1/1990 |
| JP | 02059338 | | 2/1990 |
| JP | 02081629 | | 3/1990 |
| JP | 02135269 | | 5/1990 |
| JP | 02175240 | | 7/1990 |
| JP | 02274534 | | 11/1990 |
| JP | 02292315 | | 12/1990 |
| JP | 02299839 | | 12/1990 |
| JP | 03124439 | | 5/1991 |
| JP | 03181530 | | 8/1991 |
| JP | 03182538 | | 8/1991 |
| JP | 3-275859 | * | 12/1991 |
| JP | 4049037 | | 2/1992 |
| JP | 04093317 | | 3/1992 |
| JP | 4218539 | | 8/1992 |
| JP | 04245976 | | 9/1992 |
| JP | 4272840 | | 9/1992 |
| JP | 04345842 | | 12/1992 |
| JP | 4-363370 | * | 12/1992 |
| JP | 05163456 | | 6/1993 |
| JP | 05185570 | | 7/1993 |
| JP | 5220519 | | 8/1993 |
| JP | 05320547 | | 12/1993 |
| JP | 06073330 | | 3/1994 |
| JP | 06270261 | | 9/1994 |
| JP | 06287334 | | 10/1994 |
| JP | 06287548 | | 10/1994 |
| JP | 7-4064 | * | 1/1995 |
| JP | 7-39812 | * | 2/1995 |
| JP | 07053822 | | 2/1995 |
| JP | 07148896 | | 6/1995 |
| JP | 07238252 | | 9/1995 |
| JP | 07316486 | | 12/1995 |
| JP | 08259877 | | 10/1996 |
| JP | 8-283654 | * | 10/1996 |
| JP | 09059326 | | 3/1997 |
| JP | 09087545 | | 3/1997 |
| JP | 09194554 | | 7/1997 |
| JP | 09226064 | | 9/1997 |
| JP | 09262940 | | 10/1997 |
| WO | 8705307 | | 9/1987 |
| WO | 9014393 | | 11/1990 |
| WO | WO 96/18699 | | 6/1996 |
| WO | 96 23828 | | 8/1996 |
| WO | WO 99/26992 | | 6/1999 |

* cited by examiner

RADIATION CURABLE COATING CONTAINING POLYFUOROOXETANE

CROSS REFERENCE

This is a U.S. patent application of U.S. provisional application 60/141,532, filed Jun. 28, 1999 for a Radiation Curable Coating Containing Polyfluorooxetane, which is hereby fully incorporated by reference.

FIELD OF INVENTION

Radiation curable coatings are typically formulated using unsaturated monomers and oligomers or polymers with unsaturated or reactive groups such as oxiranes therein that can be polymerized upon exposure to electron beams or exposure to ultraviolet radiation when photoinitiators are present. Polyfluorooxetane refers to oligomers and polymers that contain fluorine containing groups pendant from the oxetane backbone. The fluorine containing groups contribute low surface tension to the coating and some stain release properties.

BACKGROUND OF THE INVENTION

Traditionally radiation curable coatings utilized combinations of silicone oils, wetting agents and polyethylene waxes to provide smoothness, abrasion resistance, low friction and scratch resistance. However these materials can be largely fugitive (unreacted) in nature and thus migratory, leading to handling problems, lower durability and can work at cross-purposes leading to decreases in other coating properties such as gloss.

U.S. Pat. No. 5,411,996 disclosed the use of fluoroalcohol in U.V. epoxy-silicone coating formulations. The fluorinated alcohols were used to solubilize the U.V. initiator (sulfonium salt) to allow the polymerization reaction to occur.

U.S. Pat. No. 5,081,165 related to an anti-fouling coating composition comprising a photopolymerization initiator or thermal polymerization initiator and fluorine containing (meth)acrylate.

U.S. Pat. No. 4,833,207 relates to a curable composition for forming a cladding for an optical fiber having a refractive index of about 1.43 to 1.60.

U.S. Pat. No. 5,674,951 discloses isocyanate functionalized polyoxetane polymers with pendant fluorinated side chains that can optionally be chain extended with polyoxetanes or other polyethers, have the isocyanate group blocked, and be crosslinked into a network. These coatings were effective for glass run channels.

SUMMARY OF THE INVENTION

Polyfluorooxetane oligomers and polymers can be functionalized with acrylate, or methacrylate, or allylic, end groups and thereafter used as a polyacrylate in a radiation curable coating composition. These polyfluorooxetanes could also be called fluorinated polyoxetanes or polyoxetanes with partially fluorinated pendant side groups (chains). These fluorinated oxetane repeating units have a single pendant fluorinated side group per repeating unit or they can have two pendant fluorinated side groups per repeating unit. The coating composition comprises the traditional components to a radiation curable coating which include the acrylate, or methacrylate, or allylic, terminated oligomers or polymers, monomer, optional UV initiator, optional second polyfunctional acrylate, or methacrylate, or allylic, oligomer or polymer, and optionally other additives like pigments, plasticizers, rheology modifiers etc.

The acrylate, or methacrylate, or allylic, functionalized polyfluorooxetane can be produced by several methods, but due to the lower reactivity of the hydroxyl groups of the polyfluorooxetane with isocyanate and epoxy groups, it is desirable to sequentially add the reactants so nearly complete functionalization of the polyfluorooxetane can be achieved. Typically an isocyanate or epoxy functionalize polyfluorooxetane is first formed and that is reacted with a hydroxy alkyl acrylate, or methacrylate, or allylic, to form the acrylate, or methacrylate, or allylic, terminated polyfluorooxetane. Alternatively the acrylate, or methacrylate, or allylic, can be epoxy or isocyanate functionalized and that compound reacted with the polyfluorooxetane.

DETAILED DESCRIPTION OF THE INVENTION

Polyfluorooxetane oligomers and polymers can be functionalized with acrylate, or methacrylate, or allylic, end groups and thereafter used as a polyacrylate, or methacrylate, or allylic, in a radiation curable coating composition. These polyfluorooxetanes could also be called fluorinated polyoxetanes or polyoxetanes with partially fluorinated pendant side groups (chains). These pendant side groups include the Rf groups defined later. The coating composition comprises the traditional components to a radiation curable coating which include the acrylate, or methacrylate, or allylic, terminated oligomers or polymers, monomer, optionally UV initiator, optionally a second polyfunctional acrylate, or methacrylate, or allylic, oligomer or polymer or a polyester, and optionally other additives like pigments, plasticizers, rheology modifiers etc. While the acrylate, or methacrylate, or allylic, terminated polyfluorooxetane can be used in about any concentration in the radiation curable coating it is generally effective in an amount of repeating units of the illustrated formula from about 0.005, or from about 0.1, or from about 1 to about 10 weight percent based on the weight of the coating composition.

In a cationic UV system the oxirane ring is opened by a nucleophile. In a UV or e-beam initiated system the acrylate, or methacrylate, or allylic, functional end from a urethane reaction (irsocyante), an expoxy acrylate, transeterification or even an epichlorhydrin reaction, are polymerized, i.e., cured. The functionalized polyfluorooxetane can be produced by several methods, but due to the lower reactivity of the hydroxyl groups of the polyfluorooxetane with isocyanate and epoxy groups, it is desirable to sequentially add to reactants so nearly complete functionalization of the polyfluorooxetane can be achieved. Typically an isocyanate or epoxy functionalize polyfluorooxetane is first formed and that is reacted with a hydroxy alkyl acrylate, or methacrylate, or allylic, to form the urethane acrylate, or methacrylate, or allylic, or epoxy acrylate, or methacrylate, or allylic, terminated polyfluorooxetane. Alternatively the acrylate, or methacrylate, or allylic, can be epoxy or isocyanate functionalized and that compound reacted with the polyfluorooxetane.

The polyfluorooxetane when incorporated into a coating via the acrylate group provides improved wear resistance, scratch resistance, mar resistance, stain resistance, leveling, improved slip and lower coefficient of friction. There are generally enhanced surface properties relative to a coating without the additive. While not being bound by any explanation, it is anticipated that the polyfluorooxetane, to the extent possible while blended with the other components and after curing, migrates to the interfaces between the coating and the substrate and the interface between the coating and the atmosphere providing increased wetting at the solid interface improving adhesion, wetting, gloss/appearance and leveling, lower surface tension at the atmosphere interface for improve wear and stain resistance at the atmosphere interface. The application is focused on coating because molded articles and thicker compositions are more difficult to cure with radiation cures, but this does not preclude their use in thick articles.

The oxetane monomer used to form the polyfluorooxetane has the structure

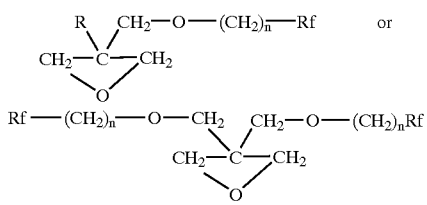

and the repeating unit derived from the oxetane monomer has the formula

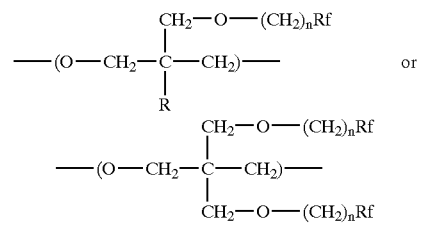

where each n is the same or different and independently, is an integer between 1 and 5, R is hydrogen or an alkyl of 1 to 6 carbon atoms, and each Rf is the same or different and individually on each repeat unit is a linear or branched fluorinated alkyl of 1 to 20 carbon atoms, a minimum of 75 percent of the non-carbon atoms of the alkyl being fluorine atoms and optionally the remaining non-carbon atoms being H, I, Cl, or Br; or each Rf is the same or different and individually is an oxaperfluorinated polyether having from 4 to 60 carbon atoms.

Another focus of this application is adding the properties of the partially of fully fluorinated pendant groups without detracting from the inherent physical properties typically found in vinyl ester resin compositions. This can be achieved as the polyoxetane backbone is very similar in polarity and molecular flexibility to the polyethers (e.g. ethylene oxide and propylene oxide) used in many vinyl ester resin compositions. Further the polyoxetane in being available as a polyol can be conveniently reacted in the network via epoxy or isocyanate reactive groups which are common to vinyl ester resin compositions.

The substrates for the radiation curable coating include thermoplastic or thermoset plastics, paper, metals, wovens and nonwovens, cellulosics other than paper, etc. Preferred plastics include polyvinyl chloride, polyesters, polycarbonates. The plastics may be formed into furniture, cabinets, flooring overlay, building products, etc. Preferred cellulosics include wood products such as furniture, cabinets, wood flooring, paper, and the like. The coating is useful as a protective coating for any of the above substrates.

The coating can be modified to be flexible or rigid depending on the flexibility of the substrate. The polarity of the coating can be adjusted by changing the polarity of the acrylate, or methacrylate, or allylic, terminated components or the monomer to make it compatible with the substrate.

The coating can be made more flexible by using less crosslinking polyfunctional acrylate, or methacrylate, or allylic, or choosing a monomer that forms a lower glass transition temperature polymer. The backbone of the polyfunctional acrylate, or methacrylate, or allylic, can also be chosen to result in a softer lower flexural modulus coating.

Various curing options are available for the coating composition. As shown in the examples some of the components cure upon standing if polymerization inhibitors are not present. Electron beam irradiation can be used to cure the coatings. If ultraviolet (UV) activated free radical initiators are present, ultraviolet light can activate curing. Combinations of two curatives from a single type can be used. The amount and types of curatives are well known to the art of radiation and UV curatives. The amount of curatives will be set forth as an effective amount that converts at least 50, 75 or 90 or even 100 weight percent of the polymerizable components of the coating into nonextractable gel.

The monomers that can be used in the coating are generally any unsaturated monomers copolymerizable through said unsaturation with the acrylate, or methacrylate, or allylic, functionalized polyfluorooxetane. Monomers can be distinguished from the latter described polyfunctional oligomers or acrylate, or methacrylate, or allylic, functionalized polyfunctional oligomers by the fact that monomers are generally polyfunctional while polyfunctional reactants form crosslinked polymers. Further monomers are generally lower in viscosity and more volatile than the oligomers. Preferred monomers include vinyl aromatic monomers of 8 to 12 carbon atoms, acrylates of 4 to 30 carbon atoms, and N-vinyl pyrrolidone. The monomer(s) are generally selected based upon a variety of considerations including volatility, relative health hazards from exposure, their reactivity ratios in copolymerization with the acrylate terminated polymers and oligomers, etc. It is generally desirable that at least 50, 70, or 80 mole percent of the oligomers are copolymerized into monomers and other reactants before 90 mole percent of the monomer is converted to polymer.

The polyfunctional oligomers and polymers (other than the acrylate, or methacrylate, or allylic, terminated polyfluorooxetane) are conventional components in radiation curable coatings. They are characterized by the presence of two or more unsaturated carbon to carbon double bonds that can copolymerize with the monomer(s), or oxirane terminated (co)polymer (cationic). These components are added in effective amounts to change the physical properties of the coatings such as crosslink density, which has an effect on modulus and strength. These reactants contribute significantly to the solvent resistance of the cured coatings as the crosslinks they provide inhibit swelling in common solvents. Examples of these components include Ebycyrl 4833, an acrylated aliphatic urethane oligomer; TRPGDA, tripropylene glycol diacrylate; and TMPTA, trimethylolpropane triacrylate.

Ultraviolet light (UV) activated curative(s) may be used in the coating in an effective amount to cause polymerization of the monomer(s) and crosslinking by the polyfunctional oligomers and polymers. These curatives may be any chemical compound that can generate free radicals on exposure to ultraviolet radiation. UV activated curatives are set forth in U.S. Pat. Nos. 5,411,996; 4,882,201 and 4,279,717 herein incorporated by reference. Other UV activated curatives such as Cyracure UVR-6110 and Cyracure UVI-6974 used in the examples are commercially available and known to the art.

Other components to the coating include fillers such as $TiO_2$, and other pigments and colorants; antigloss agents such as precipitated silicas; dyes; plasticizers such as ester oils, triglycerides, hydrocarbon oils, waxes; flow modifiers such as rheology modifiers, shear thinning agents; accelerators such as amines; and wetting agents and surface modifiers for fillers.

The oxetane polymer (including copolymers, terpolymers, etc.) generally have one or more and preferably two or more terminal hydroxyl groups. Molecules with one or more hydroxyl groups are generally referred to as polyols. These desirably have degrees of polymerization from about 2, 3, or 4 to about 150, more desirably from about 3 to about 100 and preferably from about 3 to about 30 or 50. Desirably they have from about 1.5 to about 3.2 hydroxyl groups per molecule on average. The polyfluorooxetane polyol comprises at least 10 weight percent repeating units of the following formula

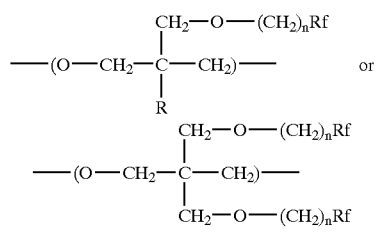

The reactivity of the polyfluorooxetane with isocyanate groups and with epoxy groups is generally not as good as the reactivity of conventional polyethers such as poly(ethylene oxide) with isocyanates and epoxies. Therefore it is desirable to control the reaction sequence and reaction ratios to maximize the functionalization of the polyfluorooxetane with the isocyanate or epoxy groups and then with the acrylate functionality.

One procedure is to first react the polyfluorooxetane with the di or poly isocyanate or di or poly epoxy compound to generate (form) isocyanate or epoxy groups on the ends (termini) of the polyfluorooxetane (isocyanate or epoxy terminated polyfluorooxetane). Catalysts and or other favorable reaction conditions (heating) may be employed to force these reactions towards completion.

The reaction between the hydroxy groups and the isocyanate or epoxy groups can be monitored by various chemical analysis methods to optimize reaction conditions. Desirably at least 2 moles of isocyanate groups or epoxy groups are present for every mole of hydroxyl groups. This promotes end capping of the polyfluorooxetane rather than chain extension, which is the predominant reaction when the ratio of isocyanate or epoxy groups to hydroxyl groups is 1:1. In most embodiments chain extension is not desirable as the resulting higher molecular weight polymers increase the coating viscosity and may decrease the number of load bearing chains, which can decrease physical properties. Desirably the moles of isocyanate groups or epoxy groups is between 2 and 3 per mole of hydroxyl groups and more desirably between 2.0 and 2.5. Other reaction conditions can be optimized to further limit chain extension.

After an isocyanate or epoxy terminated polyfluorooxetane is formed it can be reacted with an acrylate, or methacrylate, or allylic, molecule that has a pendant group which is reactive with an isocyanate or epoxy group to form a chemical bond between the isocyanate group or epoxy group and the acrylate, or methacrylate, or allylic. Hydroxy alkyl acrylates, such as hydroxy ethyl acrylate or hydroxy ethyl (alk)acrylate are preferred as the hydroxyl groups forms a very chemically stable urethane linkage. The use of "(alk)" before acrylate is used to indicate the optional inclusion of alkyl substituents of 1 to 6 carbon atoms. Other acrylate functional monomer(s) that can be attached to the isocyanate or epoxy functionalized polyfluorooxetane include amine functional acrylates, acrylamides, or acrylic acids.

Another way to achieve the same result is to react the di or polyfunctional isocyanate or epoxy compound with the acrylate, or ethacrylate, or allylic, functional monomer in a mole ratio of isocyanate or epoxy groups to the functional group of the acrylate, or methacrylate, or allylic, (e.g. hydroxyl) of above 2:1, more desirably from about 2 to 3 and preferably from about 2 to about 2.5. This will form an isocyanate or epoxy functionalized acrylate, or methacrylate, or allylic, under the right conditions. These isocyanate or epoxy functional acrylates, or methacrylate, or allylic, can be reacted with the polyfluorooxetane to produce an acrylate, or methacrylate, or allylic, terminated polyfluorooxetane.

The di or polyisocyanate compound can generally be any compound of the formula $X\text{-}(NCO)_y$ where y is an integer of 2 or more and X is an aliphatic group of 4 to 100 carbon atoms, an aromatic group of 6 to 20 carbon atoms, or a combination of alkyl and aromatic groups or alkyl substituted aromatic or aromatic substituted alkyl of 7 to 30 carbon atoms or oligomers thereof, These isocyanate compounds are well known to the art. Preferred ones are 4',4-methylene diphenyl isocyanate (MDI) as polymeric MDI, which is a liquid rather than a crystalline solid, toluene diisocyanate, 1,6-hexane diisocyanate, isophorone (preferred) diisocyanate, trimethylhexane diisocyanate, etc.

Similarly the epoxy compounds can generally have the formula

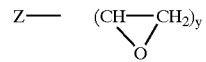

where y is as previously defined and Z is a di or polyvalent group having from 2 to 100 carbon atoms, often 1 or more oxygen atoms, and sometimes other heteroatoms besides oxygen and hydrogen. It is desirable to keep the molecular weight of the epoxy compound as low as higher molecular weights will increase the viscosity.

EXPERIMENTAL

EXAMPLES 1–5

Poly-fluorinated oxetane diols (poly-FOX) were prepared using the method described in U.S. Pat. No. 5,650,483 using a $BF_3$-THF initiating species to produce an oxetane-tetrahydrofuran copolymer with the specified level of tetrahydrofuran comonomer.

| Example | Rf | Description | Amount of THF in polymer (mole %) | Number average molecular weight |
|---|---|---|---|---|
| 1 | $CF_3$ | Poly-3-FOX | 6.4 | 2800 |
| 2 | $CF_3$ | Poly-3-FOX | 6.2 | 3400 |
| 3 | $CF_3$ | Poly-3-FOX | 8.2 | 2300 |
| 4 | $CF_3$ | Poly-3-FOX | 26.4 | 4200 |
| 5 | $-(CF_2)_2-CF_3$ | Poly-7-FOX | 7.3 | 2200 |

EXAMPLE 6

Prepartion of Di-urethane-acrylate of Poly-7-FOX

A 250 mL, 3 neck round bottom flask fitted with a mechanical stirrer and a thermometer was dried under nitrogen and charged with poly-7-FOX diol (polyfuorooxetane diol with heptafluoro group) (24.3 grams, 9.1 meq.) from Example 5. Isoperhone diisocyanate (3.0 grams, 27.2 meq) and dibutyl tin dilaurate (12 mg) were added and the mixture was heated at 70 C. for 14 hours. The reaction mixture was cooled to room temperature and washed with heptane (2 times 100 mL each). The isocyanate-terminated poly-7-FOX prepolymer was then dissolved in tetrahydrofuan (50 mL) and treated with dibutyltin dilaurate (12 mg). The resulting solution was reacted with 2-hydroxylethylacrylate (HEA, 1.16 gram, 10 meq) at room temperature. No observable exotherm was observed on the addition of HEA. The progress of the reaction was monitored by following the disappearance of the isocyanate band in an infrared spectroscopic spectrum (IR) at 2270 $cm^{-1}$. The mixture was heated at a temperature of 60 C. for 4 hours. On completion, as indicated by the disappearance of the NCO band in the IR, the reaction mixture was precipitated into water (450 mL). The resulting solution was dried over magnesium sulfate, filtered and stripped of solvent under reduced pressure to produce 17.2 grams of a urethane-acrylate terminated poly-7-FOX.

EXAMPLES 7–10

The following general procedure was used to generate examples 7–10. A 3-liter, 4-neck round bottom flask fitted with a mechanical stirrer, condenser, and a thermometer was dried under nitrogen and charged with poly-3-FOX diol (405 grams, 0.29 eq). Isoperhone diisocyanate (69 grams, 0.61 eq) and dibutyltin dilaurate (0.2 gram) were added at room temperature. A mild exotherm resulting in a temperature increase from 26 to 30 C. was observed. The resulting mixture was stirred at ambient temperature for one hour and then heated to 65 C. for one hour. The mixture was then cooled to 30 C. and 2-hydroxyethyl acrylate (37.4 grams, 0.32 eq.) was added over a thirty-minute period. The mixture was stirred at ambient temperature for 16 hours at which point IR analysis revealed the presence of a strong NCO stretching band at 2270 cm-1. Dibutyltin dilaurate catalyst (0.3 grams) was added and the mixture was heated at 60 C. for 3 hours and then at ambient temperature for 16 hours. A 50 gram sample of acrylate material was removed. An inhibitor (4-methoxphenol, 0.47 grams) was added and the mixture was stirred vigorously to disperse the inhibitor. The resulting mixture, a colorless viscous oil, was transferred to disperse the inhibitor. The resulting mixture, a colorless viscous oil, was transferred to a plastic carboy and retained for further use. Overall 505 grams of the co-polymer was isolated representing a yield of 98.7%.

| Acrylated Example | Starting poly-FOX Diol |
| --- | --- |
| 7 | 1 |
| 8 | 2 |
| 9 | 3 |
| 10 | 4 |

| Testing Procedures for UV Coatings | |
| --- | --- |
| Burnish | The mar resistance was evaluated by putting a pestle onto the coated paper and making a circular motion with firm pressure. If a burnish mar resulted, it would generally not be removed through rubbing with isopropyl alcohol. |
| Adhesion | Cross-Hatch |
| Hoffman Scratch Test | Gardner Scratch, Adhesion and Mar Tester |
| 60 Gloss % | The gloss of a coating was measured with the Gardner gloss meter set at a 60 degree angle of incidence. Two separate measurements of five readings were taken. |
| Contact Angle | The contact angles were measured with water as the liquid using the First Ten Angstrom FTA 200. Three contact angles were measured at different locations on each specimen. During the data collection process, the computer recorded an image of the drop every 0.1 seconds for 15 seconds (150 images), and calculates a contact angle for each image. |

General Procedure for Preparation of Coating Formulations

The monomers and acrylated resins (e.g. Ebecryl 81, Ebecryl 4833, TRPGDA, and TMPTA) were weighted into a reactor and mixed at 50 C. for 30 minutes. The reactor was cooled to room temperature (approximately 25 C.) while mixing. To the reactor contents were added the acrylated-poly-FOX prepolymer, and any of the constituents of the formulation (i.e. deglossing agent (silica), coalescent (N-vinyl pyrrolidone), initiator (not needed in electron beam cures) (Irgacure 500), antioxidant (Irganox 1035)) and the system was stirred until completely mixed (approximately 30 minutes).

General Procedure for UV Curing of Coatings

Coating formulations were applied to the substrates via gravure cylinder or wire wound rods at a nominal thickness of 1 to 2 mil. The coated substrates were placed on a conveyor at a speed of approximately 20 feet/min through the curing chamber. The mercury lamp emitted a 0.045 J/sq cm dose and a 0.055 W/sq cm intensity in the UVC region as measured by the EIT Powerpuck.

| General Formulation for UV Coatings for Application to PVC Substrates | | |
| --- | --- | --- |
| Chemical | Tradename or Abbreviation | Weight Percent |
| Acrylated aliphatic urethane oligomer | Ebycryl 4833 | 36.36 minus level of FOX diacrylate |
| Tripropylene glycol diacrylate | TRPGDA | 20.65 |
| Trimethylolpropane triacrylate | TMPTA | 5.20 |
| Benzophenone and 1-hydroxy acetophenone | Irgacure 500 | 6.61 |
| N-methylethanolamine | | 1.76 |
| Antioxidant | Irganox 1035 | 0.29 |
| N-vinylpyrrolidone | NVP | 8.47 |
| Low viscosity amine modified acrylated polyester oligomer | Ebecryl 81 | 20.66 |
| Diacrylated Poly-3-FOX | | variable |

The aliphatic urethane was warmed to 110 to 130 F. and blended to the polyol-polyether, TMPTA, TMPDA, NVP and di-urethane acrylate poly-3-FOX at 106 C. for 30 minutes. The formulations were allowed to cool before introduction of photo-initiators (i.e. benzophenone), 2-hydroxyl-2-methyl phenyl propane, and the antioxidant.

The formulations were applied to the flexible black PVC with RDS 05 wire wound rod at ambient temperature, and cured on a Union Carbide Linde PDCS UV unit with the following setup:

1. One 200 watt/inch lamp was on
2. Line speed of approximately 30 feet per minute
3. Samples were taped on the topside to the conveyor belt and sent through one at a time.

EXAMPLE 11

Properties of UV Coatings Effect of Level of Acrylated Poly-3-FOX on Coating Performance when Applied to Flexible PVC Cured Under Air

| Example 7 Wt. % | Gloss % | Hoffman Scratch Resistance (g) | Mar Resistance |
| --- | --- | --- | --- |
| 0.0 | 51 | 1200 | 8 |
| 0.5 | 91 | 2000 | 10 |
| 1.0 | 96 | 2000 | 10 |
| 2.0 | 93 | 2300 | 10 |
| 4.0 | 97 | 2300 | 10 |

EXAMPLES 12 TO 16

Properties of UV Coatings, Effect of FOX Copolymer Composition on Coating Performance when Applied to Flexible PVC Cured Under Nitrogen

| Example | Poly-3-FOX diacrylate used in Example | Weight Percent of Poly-3-FOX diacrylate | Hoffman Scratch (g) | Coefficient of Friction static | | Cracking |
| --- | --- | --- | --- | --- | --- | --- |
| | | | | | kinetic | |
| 12 | Control | 0 | 1900 | 3.48 | 3.61 | Severe |
| 13 | 7 | 3 | 2900 | 1.67 | 0.50 | Severe |
| 14 | 8 | 3 | 2900 | 0.89 | 2.23 | Severe |
| 15 | 9 | 3 | 2900 | 1.24 | 1.60 | Moderate |
| 16 | 10 | 3 | 2900 | 3.51 | 4.40 | Severe |

EXAMPLE 17

Formulation of Paper Coatings Cured via UV Radiation

| Ingredient | Amount Weight % |
| --- | --- |
| Ebecryl 4833 | 9.96 |
| Ebecryl 81 | 19.54 |
| Trimethylol propane triacrylate | 20.87 |
| Tripropylene glycol diacrylate | 26.13 |
| Ebecryl 8301 | 6.26 |
| Irgacure 500 | 3.13 |
| N-Methyl diethanol amine | 1.84 |
| Poly-3-FOX Acrylate | 0.80 |
| Syloid 308 | 3.57 |
| Polyfluo 523XF | 4.24 |
| Polyfluo 717XF | 1.69 |
| Property | Value |
| Hoffmann Scratch | 500 g |
| Mar Resistance | 8 |
| Cross-Hatch Adhesion | 100% |

While in accordance with the patent statutes the best mode and preferred embodiment has been set forth, the scope of the invention is not limited thereto, but rather by the scope of the attached claims.

What is claimed is:

1. An acrylate, or methacrylate, or allylic, terminated oligomer, polymer, or copolymer comprising the reaction product of a) at least one polyfluorooxetane oligomer, or polymer, or copolymer polyol, b) at least one di or polyisocyanate, and c) at least one hydroxy alkyl acrylate, or hydroxy alkyl methacrylate, or hydroxy allylic, wherein either i) a) and b) are reacted to form an isocyanate terminated oligomer, or polymer, or copolymer, and said isocyanate terminated oligomer, or polymer, or copolymer is reacted with c) to form an acrylate, or methacrylate, or allylic, terminated oligomer, or polymer, or copolymer or ii) b) is reacted with c) to form an isocyanate functionalized acrylate, or methacrylate, or allylic, which is then reacted with a) to form an acrylate, or methacrylate, or allylic, terminated oligomer, or polymer, or copolymer, where said at least one polyfluorooxetane, oligomer, polymer, or copolymer polyol, comprises at least 10 weight percent repeating units of the formula

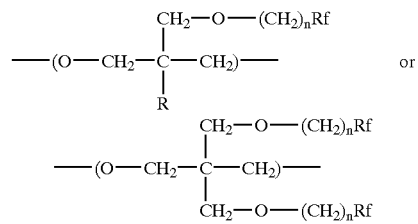

where each n is the same or different and independently, is an integer between 1 and 5, R is hydrogen or an alkyl of 1 to 6 carbon atoms, and each Rf is the same or different and individually on each repeat unit is a linear or branched fluorinated alkyl of 1 to 20 carbon atoms, a minimum of 75 percent of the non-carbon atoms of the alkyl being fluorine atoms and optionally the remaining non-carbon atoms being H, I, Cl, or Br, where said acrylate, or methacrylate, or allylic terminated copolymer includes repeat units derived from tetrahydrofuran, and said acrylate, or methacrylate, or allylic, terminated oligomer, polymer, or copolymer being radiation curable.

2. A polymer, or oligomer, or copolymer, according to claim 1, wherein said oligomer, polymer, or copolymer is cured.

3. An oligomer, polymer, or copolymer according to claim 1, wherein said polyfluorooxetane has a degree of polymerization from about 3 to about 150.

4. An oligomer, polymer, or copolymer, according to claim 1, wherein said polyfluorooxetane polyol is said copolymer.

5. A polymer, or oligomer, or copolymer, according to claim 4, wherein said oligomer, polymer, or copolymer is cured.

6. An oligomer, polymer, or copolymer according to claim 4, wherein said a) polyfluorooxetane has two terminal hydroxyl groups, and wherein said oxetane repeat units are said

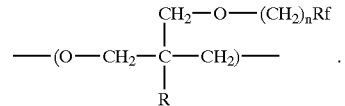

7. A polymer, or oligomer, or copolymer, according to claim 6, wherein said oligomer, polymer, or copolymer is cured.

8. An oligomer, polymer, or copolymer according to claim 6, wherein said polyfluorooxetane has a degree of polymerization from about 3 to about 50.

9. An oligomer, polymer, or copolymer according to claim 8, wherein said polyfluorooxetane has a degree of polymerization from about 3 to about 30, wherein in said formula R is $CH_3$, $R_f$ is $CF_3$, n is 1, wherein said diisocyanate is methylene diphenyl isocyanate (MDI), polymeric MDI, toluene diisocyanate, hexane diisocyanate, isophorone diisocyanate, or trimethyl hexane diisocyanate, or combinations thereof, and wherein said acrylate is hydroxy ethyl acrylate, or hydroxy ethyl methacrylate.

10. A polymer, or oligomer, or copolymer, according to claim 9, wherein said oligomer, polymer, or copolymer is cured.

11. A process for forming an acrylate, or methacrylate, or allylic, terminated oligomer, polymer, or copolymer, comprising reacting a polyfluorooxetane oligomer, polymer, or copolymer polyol either i) sequentially with a di or polyisocyanate forming an isocyanate terminated oligomer, or polymer, or copolymer and then reacting said isocyanate terminated oligomer, or polymer, or copolymer with a hydroxyl containing acrylate, or hydroxyl containing methacrylate, or hydroxyl containing allylic, and forming an acrylate, or methacrylate, or allylic, terminated polyfluorooxetane oligomer, or polymer, or copolymer, or ii) in a single step with an isocyanate functionalized acrylate, or methacrylate, or allylic, and forming an acrylate, or methacrylate, or allylic, terminated polyfluorooxetane oligomer, or polymer, or copolymer; said acrylate, or methacrylate, or allylic, terminated polyfluorooxetane oligomer, or polymer, or copolymer being radiation curable; and wherein said polyfluorooxetane oligomer, or polymer, or copolymer polyol comprises at least 10 weight percent repeating units of the formula

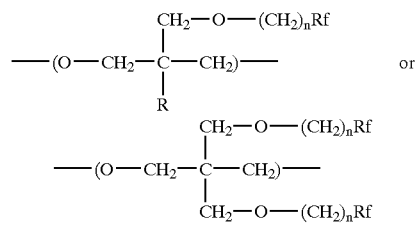

or where each n is the same or different and independently, is an integer between 1 and 5, R is hydrogen or an alkyl of 1 to 6 carbon atoms, and each Rf is the same or different and individually on each repeat unit is a linear or branched fluorinated alkyl of 1 to 20 carbon atoms, a minimum of 75 percent of the non-carbon atoms of the alkyl being fluorine atoms and optionally the remaining non-carbon atoms being H, I, Cl, or Br, and wherein said acrylate, or methacrylate, or allylic terminated copolymer includes repeat units derived from tetrahydrofuran.

12. A process according to claim 11, wherein said oligomer, or polymer, or copolymer is cured.

13. A process according to claim 11, wherein said polyfluorooxetane has a degree of polymerization of from about 3 to about 30, wherein said formula is said

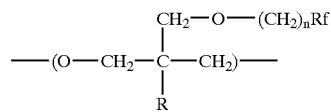

and wherein said polyfluorooxetane is said copolymer, and wherein said Rf has from 1 to 3 carbon atoms.

14. A process according to claim 13, wherein said polyfluorooxetane has two terminal hydroxyl groups and is reacted with said diisocyanate forming said isocyanate terminated polyfluorooxetane copolymer which is then reacted with said hydroxy containing alkyl acrylate, or said hydroxyl containing methacrylate, or said hydroxyl containing allylic, and wherein said acrylate is hydroxy ethyl acrylate, or hydroxy ethyl methacrylate.

15. A process according to claim 14, wherein said oligomer, or polymer, or copolymer, is cured.

16. An acrylate, or methacrylate, or allylic, terminated oligomer, or polymer, or copolymer, which is copolymerizable with styrene, methyl methacrylate or N-vinyl pyrrolidone, said oligomer, polymer, or copolymer comprising the reaction product of a) at least one polyfluorooxetane, oligomer, polymer, or copolymer polyol b) at least one di or polyisocyanate, and c) at least one hydroxy alkyl acrylate, or hydroxy alkyl methacrylate, or hydroxy allylic, wherein either i) a) and b) are reacted to form an isocyanate terminated oligomer, or polymer, or copolymer, and said isocyanate terminated oligomer, or polymer, or copolymer is reacted with c) to form an acrylate, or methacrylate, or allylic, terminated oligomer, or polymer, or copolymer or ii) b) is reacted with c) to form an isocyanate functionalized acrylate, or methacrylate, or allylic, which is then reacted with a) to form an acrylate, or methacrylate, or allylic, terminated oligomer or polymer, or copolymer, where said at least one polyfluorooxetane oligomer, polymer, or copolymer polyol comprises at least 10 weight percent repeating units of the formula

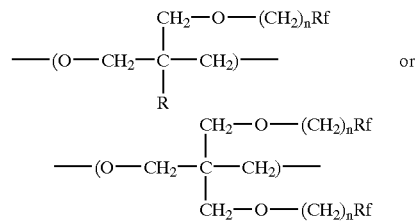

or where each n is the same or different and, independently, is an integer between 1 and 5, R is hydrogen or an alkyl of 1 to 6 carbon atoms, and each Rf is the same or different and individually on each repeat unit is a linear or branched fluorinated alkyl of 1 to 20 carbon atoms, a minimum of 75 percent of the non-carbon atoms of the alkyl being fluorine atoms and optionally the remaining non-carbon atoms being H, I, Cl, or Br, where said acrylate, or methacrylate, or allylic terminated copolymer includes repeat units derived from tetrahydrofuran, and said acrylate, or methacrylate, or allylic, terminated oligomer, polymer, or copolymer being radiation curable.

17. A polymer, or oligomer, or copolymer, according to claim 16, wherein said oligomer, polymer, or copolymer is cured.

* * * * *